United States Patent
Chen et al.

(10) Patent No.: US 11,169,179 B2
(45) Date of Patent: Nov. 9, 2021

(54) CURRENT SENSING CIRCUIT HAVING SELF CALIBRATION

(71) Applicant: Richtek Technology Corporation, Zhubei (TW)

(72) Inventors: Isaac Y. Chen, Hsinchu (TW); Chien-Fu Tang, Hsinchu (TW); Hsin-Yi Wu, Hsinchu (TW); Kai-Chuan Chan, Taichung (TW); Yu-Lin Yang, Penghu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 17/115,662

(22) Filed: Dec. 8, 2020

(65) Prior Publication Data

US 2021/0270870 A1 Sep. 2, 2021

(30) Foreign Application Priority Data

Feb. 27, 2020 (TW) ................................ 109106623

(51) Int. Cl.
| | |
|---|---|
| *G01R 1/20* | (2006.01) |
| *G01R 19/00* | (2006.01) |
| *H03F 3/45* | (2006.01) |
| *G05F 1/56* | (2006.01) |
| *G05F 3/26* | (2006.01) |
| *G01R 35/00* | (2006.01) |

(52) U.S. Cl.
CPC ......... *G01R 1/203* (2013.01); *G01R 19/0092* (2013.01); *G01R 35/005* (2013.01); *G05F 1/561* (2013.01); *G05F 3/262* (2013.01); *H03F 3/45* (2013.01)

(58) Field of Classification Search
CPC .. G01R 1/203; G01R 19/0092; G01R 35/005; H03F 3/45; G05F 1/561; G05F 3/262
USPC ..................................... 324/123 R, 721, 130
See application file for complete search history.

(56) References Cited

U.S. PATENT DOCUMENTS

| | | | |
|---|---|---|---|
| 6,765,372 B2 | 7/2004 | Isham | |
| 2019/0121383 A1* | 4/2019 | Englekirk | ............... G05F 3/242 |
| 2021/0149424 A1* | 5/2021 | Chauhan | ................. G05F 1/468 |

* cited by examiner

*Primary Examiner* — Tung X Nguyen
*Assistant Examiner* — Robert P Alejnikov, Jr.
(74) *Attorney, Agent, or Firm* — Tung & Associates

(57) ABSTRACT

A current sensing circuit having self-calibration includes two leads, a sensing element having a sensing resistance, and a sensing and calibration circuit. The sensing and calibration circuit senses and calibrates a sensing voltage of the sensing element, and senses a sensing current through the sensing element according to the sensing resistance and the sensing voltage, to generate a current sensing output signal. The sensing and calibration circuit includes two pads, a V2I circuit, a current mirror circuit and an I2V circuit. The sensing element has a first temperature coefficient (TC). The TC and/or the resistance of an adjusting resistor in the V2I circuit and an adjusting resistor in the I2V circuit are determined according to the first TC, such that the TC of the current sensing output signal is equal to 0.

17 Claims, 6 Drawing Sheets

CURRENT SENSING CIRCUIT HAVING SELF CALIBRATION

CROSS REFERENCE

The present invention claims priority to TW 109106623, filed on Feb. 27, 2020.

BACKGROUND OF THE INVENTION

Field of Invention

The present invention relates to a current sensing circuit, particularly to a current sensing circuit which has self-calibration ability.

Description of Related Art

FIG. 1 shows a prior art current sensing circuit implemented in a secondary side of a flyback power converter. The current sensing circuit includes a protocol controller circuit 1000 and a sensing resistor Rcs' which is outside the protocol controller circuit 1000 (outside the integrated circuit). The protocol controller circuit 1000 senses a current Isr flowing through the secondary side of the flyback power converter according to the resistance of the sensing resistor Rcs' and the voltage Vcs' between two terminals of the sensing resistor Rcs'. In this prior art, the protocol controller circuit 1000 uses for example bus pins D+ and D− to transmit information such as information of the current Isr in the secondary side.

The prior art shown in FIG. 1 has the following drawbacks. First, because the sensing resistor Rcs' has a temperature coefficient (TC), in order to sense the current accurately, it is required to use a resistor of high accuracy and low TC, which is costly. Second, the sensing resistor is a discrete component which will occupy more area in a circuit board.

Compared with the prior art of FIG. 1, the present invention can reduce the cost and save the circuit board area by using
the parasitic resistance of a bonding wire or an extension part of a lead as the sensing resistor. Further, the current sensing circuit of the present invention can calibrate the TC of the parasitic resistance, such that the sensed current value is accurate and is not affected by the TC. Furthermore, the current sensing circuit of the present invention also can calibrate the change of the parasitic resistance due to aging, such that the sensed current value is accurate and is not affected by events such as oxidation or solder joint loose.

SUMMARY OF THE INVENTION

From one perspective, the present invention provides a current sensing circuit having self-calibration, comprising: two leads; a sensing element having a sensing resistance, wherein the sensing element has two ends which are respectively coupled to the two leads; and a sensing and calibration circuit, configured to operably sense and calibrate a sensing voltage across the two ends of the sensing element, and configured to operably sense a sensing current flowing through the sensing element according to the sensing resistance and the sensing voltage, to generate a current sensing output signal, wherein the sensing and calibration circuit includes: two pads, respectively coupled to the two leads; a voltage to current conversion circuit (V2I circuit), configured to operably generate a first current at a first node according to the sensing voltage, wherein the V2I circuit includes a first adjusting resistor, wherein the first current is determined according to the resistance of the first adjusting resistor; a current mirror circuit, coupled to the first node, and configured to operably generate a second current at a second node according to the first current; and a current to voltage conversion circuit (I2V circuit), configured to operably generate the current sensing output signal according to the second current, wherein the I2V circuit includes a second adjusting resistor, wherein the current sensing output signal is determined according to a resistance of the second adjusting resistor; wherein the sensing element is a bonding wire or an extension of the leads, wherein when the sensing element is a bonding wire, the bonding wire has two ends which are respectively coupled to the two leads by bonding; wherein the sensing element has a first temperature coefficient (TC), wherein parameters of the first adjusting resistor and the second adjusting resistor are determined according to the first TC to compensate for the first TC, such that the current sensing output signal has a second TC which is substantially equal to 0; wherein the parameters of the first adjusting resistor and the second adjusting resistor include the resistance of the first adjusting resistor, a third TC of the first adjusting resistor, the resistance of the second adjusting resistor, and a fourth TC of the second adjusting resistor.

In one embodiment, the sensing and calibration circuit further includes a gain stage circuit which is coupled to the two pads, and configured to operably amplify the sensing voltage to generate a gain voltage; wherein the V2I circuit is coupled to the gain stage circuit, and configured to operably generate the first current at the first node according to the gain voltage.

In one embodiment, the gain stage circuit is configured as a differential amplifier circuit with a single output, wherein a voltage level of the gain voltage is a voltage level of the sensing voltage multiplied by a voltage scale-up factor, wherein the voltage scale-up factor is larger than or equal to 1.

The current sensing circuit having self-calibration of claim 2, wherein the V2I circuit further includes: an error amplifier circuit, configured to operably amplify a difference of a feedback voltage and the gain voltage to generate an error amplified signal; and a first transistor, controlled by the error amplified signal to generate the first current at the first node, wherein the first current flows through a first terminal and a second terminal of the first transistor; wherein the first adjusting resistor is coupled to the second terminal of the first transistor, and the first current flows through the first adjusting resistor, such that the feedback voltage is generated at a third node where the second terminal of the first transistor and the first adjusting resistor are connected at.

In one embodiment, the current mirror circuit includes: a second transistor, wherein a first terminal of the second transistor is coupled to a control terminal of the second transistor, and the first terminal of the second transistor is further coupled to the first node, wherein the first current flows through the first and second terminals of the second transistor; and a third transistor, wherein a control terminal of the third transistor is coupled to the control terminal of the second transistor, such that the first current is mirrored to generate the second current at the second node, wherein the second current flows through a first terminal and a second terminal of the third transistor; wherein the second adjusting resistor is coupled to the second node, and the second current flows through the second adjusting resistor, such that the current sensing output signal is generated at the second node.

In another aspect, the present invention provides a current sensing circuit having self-calibration, comprising: two leads; a sensing element having a sensing resistance, wherein the sensing element has two ends which are respectively coupled to the two leads, wherein the sensing element has a first temperature coefficient (TC); and a sensing and calibration circuit, configured to operably sense and calibrate a sensing voltage of the sensing element, and configured to operably sense a sensing current flowing through the sensing element according to the sensing resistance and the sensing voltage, to generate a current sensing output signal, wherein the sensing and calibration circuit includes: two pads, respectively coupled to the two leads; a voltage to current conversion circuit (V2I circuit), configured to operably generate a first current at a first node according to the sensing voltage, wherein the V2I circuit includes a first adjusting resistor, wherein the first current is determined according to the resistance of the first adjusting resistor; a current mirror circuit, coupled to the first node, configured to operably generate a second current at a second node according to the first current; a current to voltage conversion circuit (I2V circuit), configured to operably generate the current sensing output signal according to the second current, wherein the I2V circuit includes a second adjusting resistor, wherein the current sensing output signal is determined according to a resistance of the second adjusting resistor; a temperature sensing circuit, configured to operably sense a first reference temperature and a second reference temperature in a production mode, and sense an operating temperature in an operation mode; wherein the first TC is determined according to the first reference temperature, the current sensing output signal at the first reference temperature, the second reference temperature, and the current sensing output signal at the second reference temperature; and an adjusting circuit, configured to operably adjust the resistance of the first adjusting resistor and/or the resistance of the second adjusting resistor according to the first TC and the operating temperature in the operation mode to compensate the first TC, such that the current sensing output signal has a second TC which is substantially equal to 0; wherein the sensing element is a bonding wire or an extension of the leads, wherein when the sensing element is a bonding wire, the bonding wire has two ends which are respectively coupled to the two leads by bonding.

In another aspect, the present invention provides a current sensing circuit having self-calibration, comprising: two leads; a sensing element having a sensing resistance, wherein the sensing element has two ends which are respectively coupled to the two leads; and a sensing and calibration circuit, configured to operably sense and calibrate a sensing voltage of the sensing element, and configured to operably sense a sensing current flowing through the sensing element according to the sensing resistance and the sensing voltage, to generate a current sensing output signal, wherein the sensing and calibration circuit includes: two pads, respectively coupled to the two leads;

a voltage to current conversion circuit (V2I circuit), configured to operably generate a first current at a first node according to the sensing voltage, wherein the V2I circuit includes a first adjusting resistor, wherein the first current is determined according to the resistance of the first adjusting resistor; a current mirror circuit, coupled to the first node, configured to operably generate a second current at a second node according to the first current; a current to voltage conversion circuit (I2V circuit), configured to operably generate the current sensing output signal according to the second current, wherein the I2V circuit includes a second adjusting resistor, wherein the current sensing output signal is determined according to a resistance of the second adjusting resistor; a current generating circuit, configured to operably generate a test current; an analog to digital conversion circuit (ADC circuit), configured to operably convert the current sensing output signal to a digital signal, wherein in a first period in a production mode, the test current is set to a first current level, such that the digital signal corresponds to a first digital signal, and in a second period in the production mode, the test current is set to a second current level, such that the digital signal corresponds to a second digital signal, wherein in a third period in a power-on test procedure, the test current is set to the first current level, such that the digital signal corresponds to a third digital signal, and in a fourth period in the power-on test procedure, the test current is set to a second current level, such that the digital signal corresponds to a fourth digital signal; wherein an initial resistance of the sensing element is determined according to the first current level, the first digital signal, the second current level and the second digital signal, and wherein a real-time resistance of the sensing element is determined according to the first current level, the third digital signal, the second current level and the fourth digital signal; and an adjusting circuit, wherein in the power-on test procedure, the adjusting circuit is configured to operably control the resistance of the first adjusting resistor and/or the resistance of the second adjusting resistor according to the initial resistance and the real-time resistance of the sensing element to compensate a difference between the real-time resistance and the initial resistance, such that the real-time current sensing output signal does not substantially change in the situation that the sensing element changes over time; wherein the sensing element is a bonding wire or an extension of the leads, and wherein when the sensing element is a bonding wire, the bonding wire has two ends which are respectively coupled to the two leads by bonding.

In one embodiment, the sensing element has a first temperature coefficient (TC), wherein the sensing and calibration circuit further includes a temperature sensing circuit, configured to operably sense a first reference temperature and a second reference temperature in the production mode, and sense an operating temperature in an operation mode; wherein the first TC is determined according to the first reference temperature, the current sensing output signal at the first reference temperature, the second reference temperature, and the current sensing output signal at the second reference temperature; wherein the adjusting circuit is further configured to operably adjust the resistance of the first adjusting resistor and/or the resistance of the second adjusting resistor according to the first TC and the operating temperature in the operation mode to compensate the first TC, such that the current sensing output signal has a second TC which is substantially equal to 0.

In one embodiment, the current generating circuit includes: a first error amplifier circuit, configured to operably amplify a difference between a test voltage and a test reference voltage according to an enable signal to generate a test signal; a test transistor, controlled by the test signal to generate a test current, wherein a first terminal of the test transistor is coupled to a first lead of the two leads, wherein the test current flows through the sensing element; and a test resistor, coupled to a second lead of the two leads, wherein the test current flows through the test resistor, such that the test voltage is generated at a feedback node where the second lead and the test resistor are connected at; wherein a current level of the test current is determined according to the test voltage and the test resistor.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
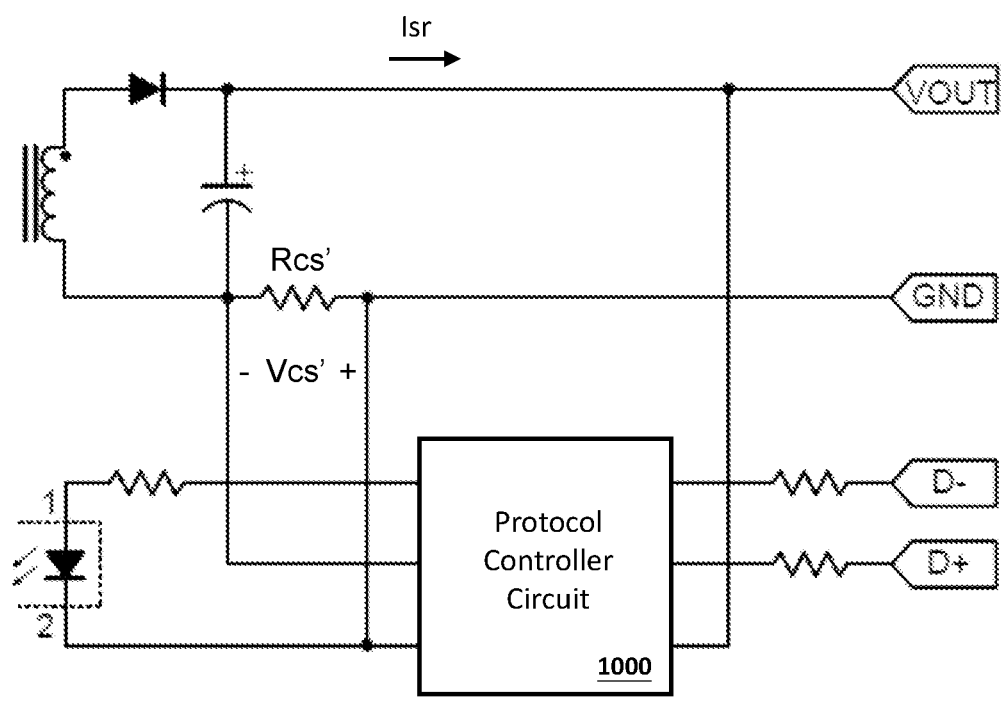
FIG. 1 shows a prior art current sensing circuit implemented in a secondary side of a flyback power converter.
Figure 2:
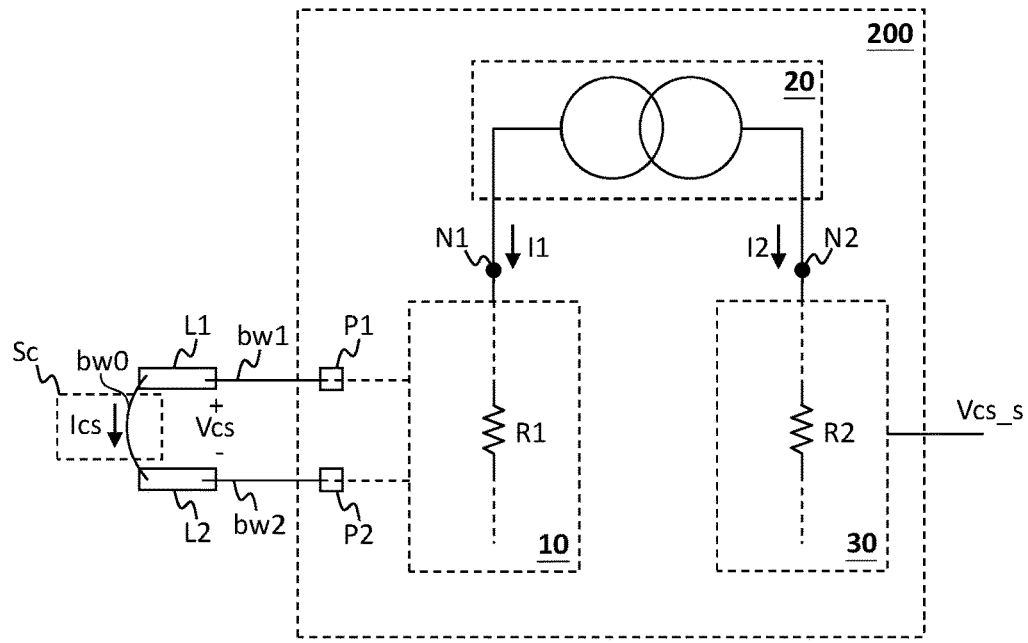
FIG. 2 shows a schematic block diagram of a current sensing circuit having self-calibration according to an embodiment of the present invention.

FIG. 2 shows a schematic block diagram of a current sensing circuit having self-calibration according to an embodiment of the present invention (current sensing circuit 2000). In one embodiment, the current sensing circuit 2000 comprises two leads (lead L1 and lead L2 as shown in FIG. 2), a sensing element Sc and a sensing and calibration circuit 200. In this embodiment, the sensing and calibration circuit 200, the lead L1 and the lead L2 are packaged in an integrated circuit package, wherein the lead L1 and the lead L2 are the pins of the integrated circuit package, and the sensing and calibration circuit 200 is formed in a die.

In one embodiment, as shown in FIG. 2, the sensing element Sc is a bonding wire bw0, wherein the two ends of the sensing element Sc are respectively coupled to the lead L1 and the lead L2 by bonding. The sensing element Sc has a sensing resistance (i.e. the parasitic resistance of the sensing element Sc). In one embodiment, the sensing and calibration circuit 200 is configured to operably sense and calibrate a sensing voltage Vcs of the sensing element Sc, and sense a sensing current Ics flowing through the sensing element Sc according to the sensing resistance of the sensing element Sc and the sensing voltage Vcs, to generate a current sensing output signal Vcs_s.

In one embodiment, the sensing and calibration circuit 200 includes two pads (pad P1 and pad P2 as shown in FIG. 2), a voltage to current conversion circuit (V2I circuit 10), a current mirror circuit 20 and a current to voltage conversion circuit (I2V circuit 30). In one embodiment, the pad P1 and the pad P2 are respectively coupled to the lead L1 and the lead L2; specifically, the pad P1 and the pad P2 are respectively bonding to the lead L1 and the lead L2 by a bonding wire bw1 and a bonding wire bw2. In one embodiment, the V2I circuit 10 is coupled to the pad P1 and the pad P2 and is configured to operably generate a first current I1 at a first node N1 according to the sensing voltage Vcs. The V2I circuit 10 includes a first adjusting resistor R1, wherein the first current I1 is determined according to the resistance of the first adjusting resistor R1. In one embodiment, the current mirror circuit 20 is coupled to the first node N1 and is configured to operably generate a second current I2 at a second node N2 according to the first current I1. In one embodiment, the I2V circuit 30 is configured to operably generate the current sensing output signal Vcs_s according to the second current I2, wherein the I2V circuit 30 includes a second adjusting resistor R2, wherein the current sensing output signal Vcs_s is determined according to a resistance of the second adjusting resistor R2.

Still referring to FIG. 2, in one embodiment, the sensing element Sc has a first Temperature Coefficient (TC), and the current sensing output signal Vcs_s has a second TC. In one embodiment, the first adjusting resistor R1 and the second adjusting resistor R2 have parameters including: the resistance of the first adjusting resistor R1, a third TC of the first adjusting resistor R1, the resistance of the second adjusting resistor R2 and a fourth TC of the second adjusting resistor R2. In one embodiment, parameters of the first adjusting resistor R1 and the second adjusting resistor R2 are determined according to the first TC to compensate for the first TC, such that the second TC of the current sensing output signal is substantially equal to 0. Specifically, due to the first TC, the sensing resistance of the sensing element Sc changes as the temperature changes. Before calibration by the current sensing circuit of the present invention, the second TC of the current sensing output signal Vcs_s is related to the first TC, so the value of the current sensing output signal Vcs_s changes depending on the temperature; however, by the calibration of the current sensing circuit of the present invention, by determining the parameters of the first adjusting resistor R1 and the second adjusting resistor R2 to compensate for the first TC, the second TC is substantially equal to 0, that is, the value of the current sensing output signal Vcs_s will not be affected by the temperature.

Figure 3:
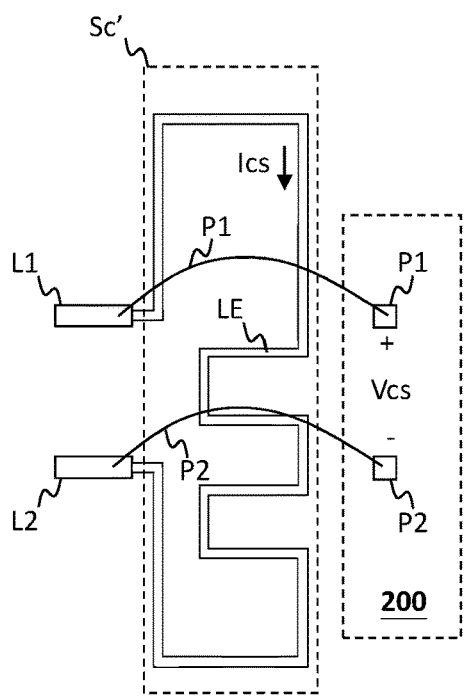
FIG. 3 shows another embodiment of a sensing element in the current sensing circuit having self-calibration according to the present invention.

FIG. 3 shows another embodiment of a sensing element in the current sensing circuit having self-calibration according to the present invention (sensing element Sc'). As shown in FIG. 3, in one embodiment, the sensing element Sc' is an extension LE of the leads, and the parasitic resistance of the extension LE of the leads is the sensing resistance as mentioned above. In one embodiment, the extension LE of the leads is made up of the same material as the leads L1 and L2, and is connected to and extending from the leads, and for example is located on the same leadframe. By designing the length and the width of the extension LE, the extension LE can have the required sensing resistance.

Figure 4:
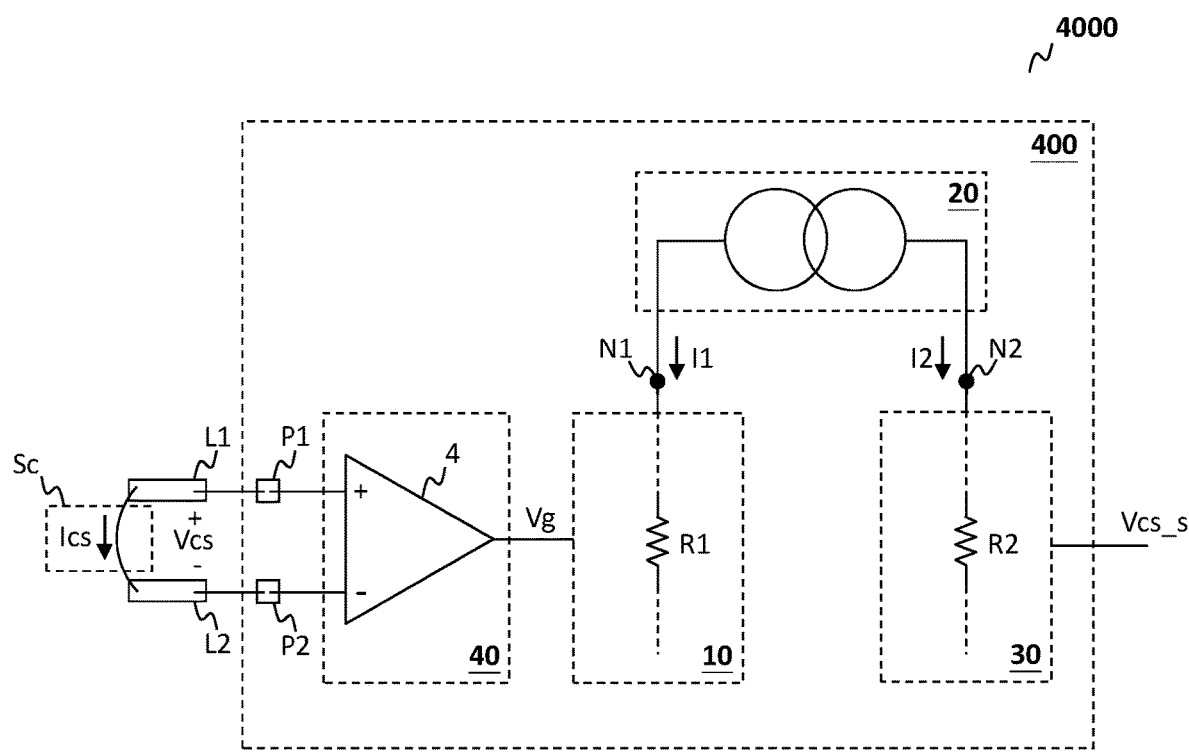
FIG. 4 shows an embodiment of a current sensing circuit having self-calibration according to the present invention.

FIG. 4 shows an embodiment of a current sensing circuit having self-calibration according to the present invention (current sensing circuit 4000). In one embodiment, the sensing and calibration circuit 400 in the current sensing circuit 4000 further includes a gain stage circuit 40. In one embodiment, the gain stage circuit 40 is configured as a differential amplifier circuit 4 with a single output. In one embodiment, the gain stage circuit 40 is coupled to the pads P1 and P2, and is configured to operably amplify the sensing voltage Vcs to generate a gain voltage Vg, wherein the voltage level of the gain voltage Vg is the voltage level of the sensing voltage Vcs multiplied by a voltage scale-up factor, wherein the voltage scale-up factor is larger than or equal to 1. In one embodiment, the voltage scale-up factor is for example equal to 20 to amplify the sensing voltage Vcs to generate the gain voltage Vg having a higher voltage level. In one embodiment, the V2I circuit 10 is coupled to the gain stage circuit 40, and is configured to operably generate the first current I1 at the first node N1 according to the gain voltage Vg.

Figure 5A:
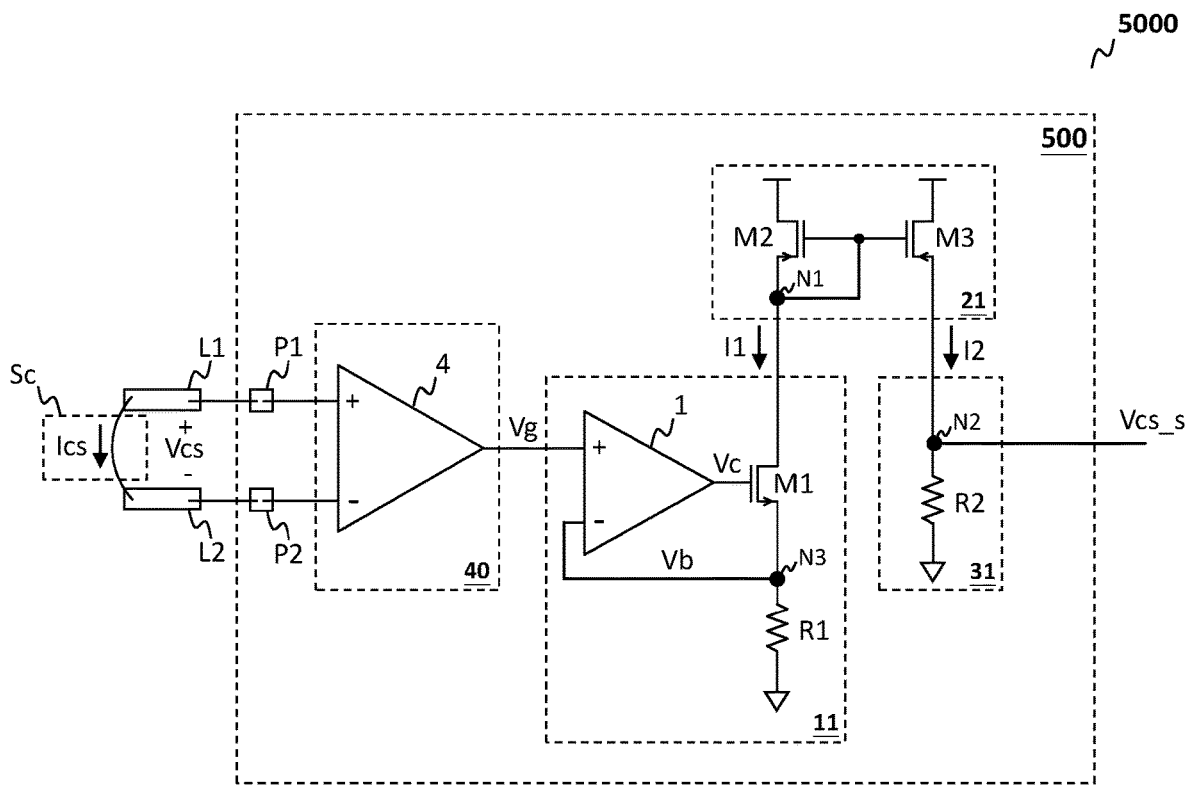
FIG. 5A shows a specific embodiment of a current sensing circuit having self-calibration according to the present invention.

FIG. 5A shows a specific embodiment of a current sensing circuit having self-calibration according to the present invention (current sensing circuit 5000). In one embodiment, the sensing and calibration circuit 500 in the current sensing circuit 5000 includes the gain stage circuit 40, a V2I circuit 11, a current mirror circuit 21 and a I2V circuit 31.

In one embodiment, the V2I circuit 11 further includes an error amplifier circuit 1 and a first transistor M1. In one embodiment, the error amplifier circuit 1 is configured to operably amplify a difference between a feedback voltage Vb and the gain voltage Vg to generate an error amplified signal Vc. In one embodiment, the gain voltage Vg is coupled to a positive input terminal of the error amplifier circuit 1. In one specific embodiment, the first transistor M1 has a control terminal (corresponding to a gate of the first transistor M1 if the first transistor is a MOS transistor), a first terminal (corresponding to a drain of the first transistor M1 if the first transistor is a MOS transistor) and a second terminal (corresponding to a source of the first transistor M1 if the first transistor is a MOS transistor); for simplicity, the following description will be based on the embodiment that the first transistor is a MOS transistor, but in another embodiment, a BJT transistor is also workable. In one embodiment, the gate of the first transistor M1 is controlled by the error amplified signal Vc to generate the first current I1 at the first node N1, and the first current I1 flows through the drain-source of the first transistor M1. In one embodiment, the first adjusting resistor R1 is coupled to the source of the first transistor M1, and the first current I1 flows through the first adjusting resistor R1, such that the feedback voltage Vb is generated at a third node N3 where the source of the first transistor M1 and the first adjusting resistor R1 are connected at. In one embodiment, the feedback voltage Vb is coupled to a negative input terminal of the error amplifier circuit 1, forming a negative feedback path, whereby the voltage level of the feedback voltage Vb is regulated to be substantially equal to the voltage level of the gain voltage Vg.

In one embodiment, the current mirror circuit 21 includes a second transistor M2 and a third transistor M3. In one specific embodiment, each of the second transistor M2 and the third transistor M3 has a control terminal (corresponding to a gate of the second transistor M2 and a gate of the third transistor M3 if the second transistor M2 and the third transistor M3 are MOS transistors), a first terminal (corresponding to a drain of the second transistor M2 and a drain of the third transistor M3 if the second transistor M2 and the third transistor M3 are MOS transistors) and a second terminal (corresponding to a source of the second transistor M2 and a source of the third transistor M3 if the second transistor M2 and the third transistor M3 are MOS transistors); for simplicity, the following description will be based on the embodiment that the second and third transistors are MOS transistors, but in another embodiment, BJT transistors are also workable. In one embodiment, the drain of the second transistor M2 is coupled to the gate of the second transistor M2, and the drain is further coupled to the first node N1, wherein the first current I1 flows through the drain-source of the second transistor M2. In one embodiment, the gate of the third transistor M3 is coupled to the gate of the second transistor M2, such that the first current I1 is mirrored to generate the second current I2 at the second node N2, wherein the second current I2 flows through the drain-source of the third transistor M3. In one embodiment, the second current is the first current I1 multiplied by a predetermined multiplication factor, wherein the predetermined multiplication factor is for example but not limited to 1. In one embodiment, the second adjusting resistor R2 is coupled to the second node N2, and the second current I2 flows through the second adjusting resistor R2, such that the current sensing output signal Vcs_s is generated at the second node N2.

Still referring to FIG. 5A, specifically, in one embodiment, the current sensing output signal Vcs_s is generated according to the second current I2 and the second adjusting resistor R2; the second current I2 is generated according to the first current I1; the first current I1 is determined by the feedback voltage Vb and the first adjusting resistor R1; the feedback voltage Vb is substantially equal to the gain voltage Vg; the gain voltage Vg is related to the sensing current Ics and the sensing element Sc having first TC. As such, the current sensing output signal Vcs_s is determined by the sensing current Ics, the sensing element Sc, the first adjusting resistor R1 and the second adjusting resistor R2. As a result, in this embodiment, by determining the parameters of the first adjusting resistor R1 and the second adjusting resistor R2 according to the first TC of the sensing element Sc, the current sensing output signal Vcs_s will not be affected by the temperature.

Figure 5B:
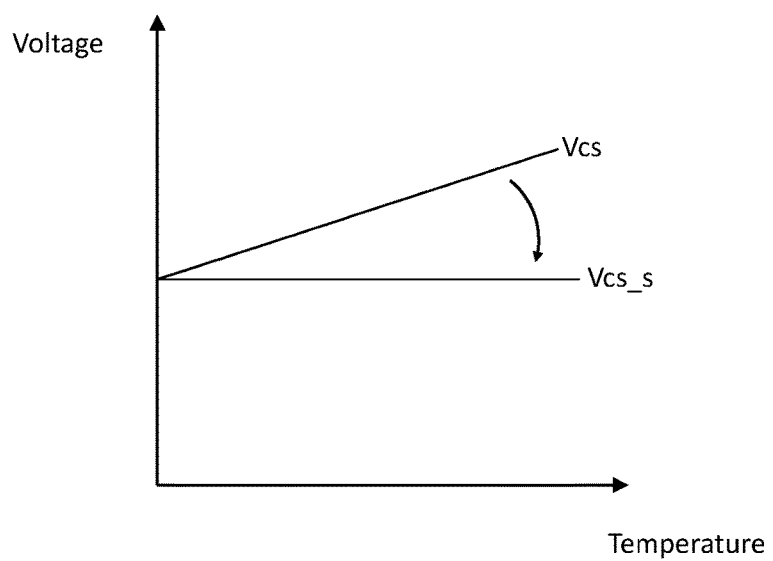
FIG. 5B is a voltage-temperature diagram showing relationships of the sensing voltage Vcs and the current sensing output signal Vcs_s versus temperature according to the present invention.

Please refer to FIG. 5A together with FIG. 5B. FIG. 5B is a voltage-temperature diagram showing relationships of the sensing voltage Vcs and the current sensing output signal Vcs_s versus temperature according to the present invention. As shown in FIG. 5B, because the sensing voltage Vcs is related to the first TC of the sensing element Sc, the value of the sensing voltage Vcs changes as the temperature changes; however because the current sensing output signal Vcs_s is generated through compensation by the parameters of the first adjusting resistor R1 and the second adjusting resistor R2, the current sensing output signal Vcs_s is substantially a definite value and not affected by the temperature.

Figure 6:
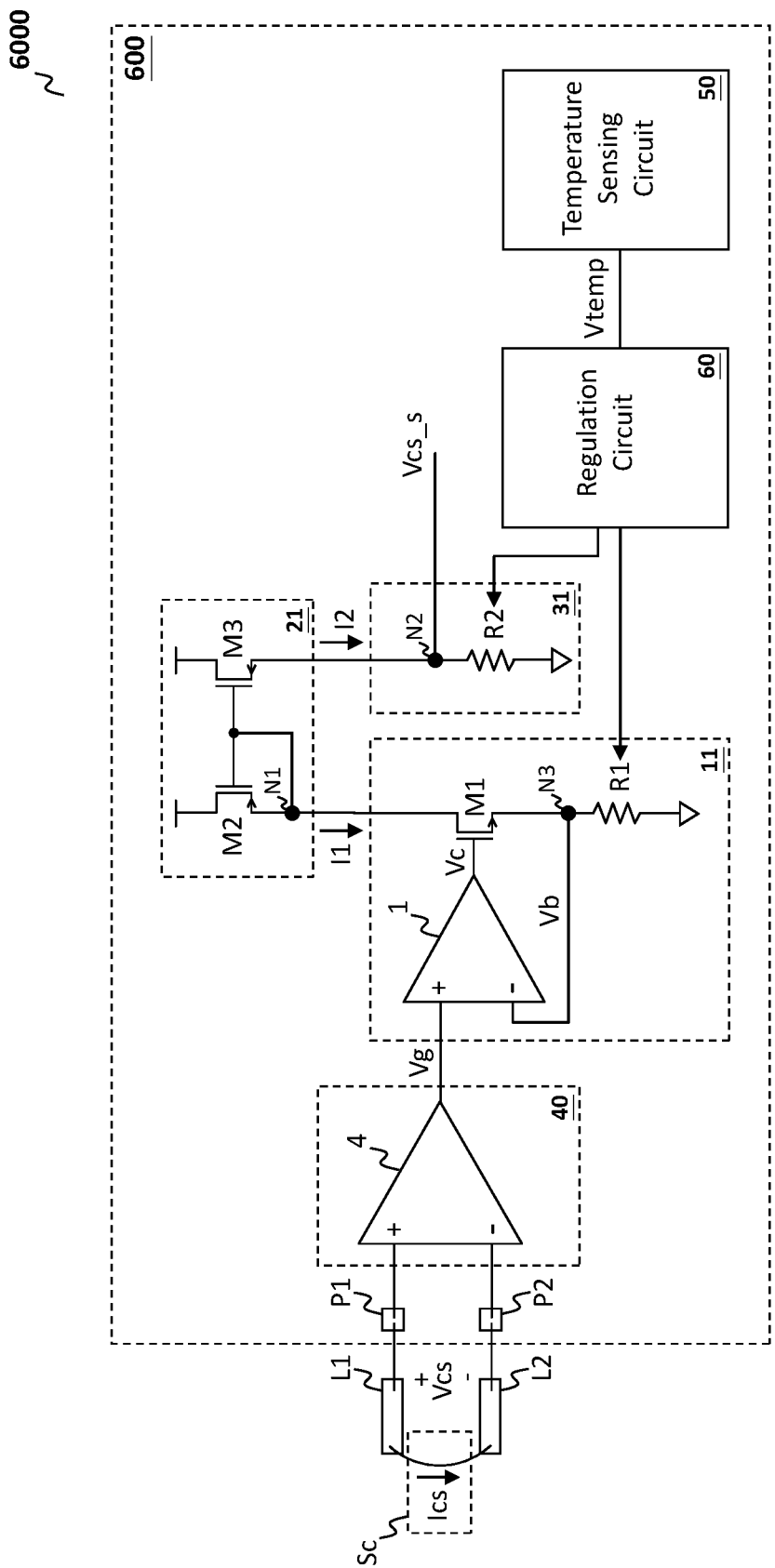
FIG. 6 shows a specific embodiment of a current sensing circuit having self-calibration according to the present invention.

FIG. 6 shows a specific embodiment of a current sensing circuit having self-calibration according to the present invention (current sensing circuit 6000). In this embodiment, the configurations and the operations of the gain stage circuit 40, the V2I circuit 11, the current mirror circuit 21 and the I2V circuit 31 in a sensing and calibration circuit 600 are the same as the embodiment in FIG. 5A, so they will not be redundantly explained here.

As shown in FIG. 6, in one embodiment, the sensing and calibration circuit 600 further includes a temperature sensing circuit 50 and an adjusting circuit 60. In one embodiment, the temperature sensing circuit 50 is configured to operably sense a first reference temperature and a second reference temperature in a production mode, and to operably sense an operating temperature in an operation mode; the temperature sensing circuit 50 generates a temperature signal Vtemp according to the sensed temperature. In one embodiment, the first TC is calculated and determined by an external test equipment or an internal circuit, according to the first reference temperature, the current sensing output signal Vcs_s at the first reference temperature, the second reference temperature, and the current sensing output signal Vcs_s at the second reference temperature.

In one embodiment, the adjusting circuit 60 is configured to operably adjust the resistance of the first adjusting resistor R1 and/or the resistance of the second adjusting resistor R2 according to the first TC and the operating temperature in the operation mode to compensate the first TC, such that the second TC of the current sensing output signal Vcs_s is substantially equal to 0, so that the value of the current sensing output signal Vcs_s will not be affected by the temperature.

For example, in one embodiment, in a first period in the production mode, a first reference temperature (e.g. room temperature 25° C.) and a current are set up, and the value of the first adjusting resistor R1 and the value of the second adjusting resistor R2 are fixed; under the above conditions, the corresponding current sensing output signal Vcs_s and temperature signal Vtemp are measured. In a second period, the above steps are repeated, and a second reference temperature (e.g. high than room temperature, such as 125° C.) and a current which is the same as the current in the first period are set up, and the value of the first adjusting resistor R1 and the value of the second adjusting resistor R2 are fixed; under the above conditions, the corresponding current sensing output signal Vcs_s and temperature signal Vtemp are measured. Accordingly, the required relationship between the first adjusting resistor R1 and the temperature, and/or the required relationship between the second adjusting resistor R2 and for the current sensing output signal Vcs_s to be not affected by the temperature, can be established. Afterwards, in the operation mode, a current which is the same as the current in the above-mentioned production mode is set up, and the temperature signal Vtemp is measured, whereby in every future operation, the adjusting circuit 60 can adjust the first adjusting resistor R1 and/or the second adjusting resistor R2 according to the temperature by the established relationships to compensate the first TC, such that the current sensing output signal Vcs_s is not affected by the temperature. In one embodiment, the adjusting operation mentioned above can be executed for example in a power-on reset stage or power-on test procedure in the operation mode.

Figure 7:
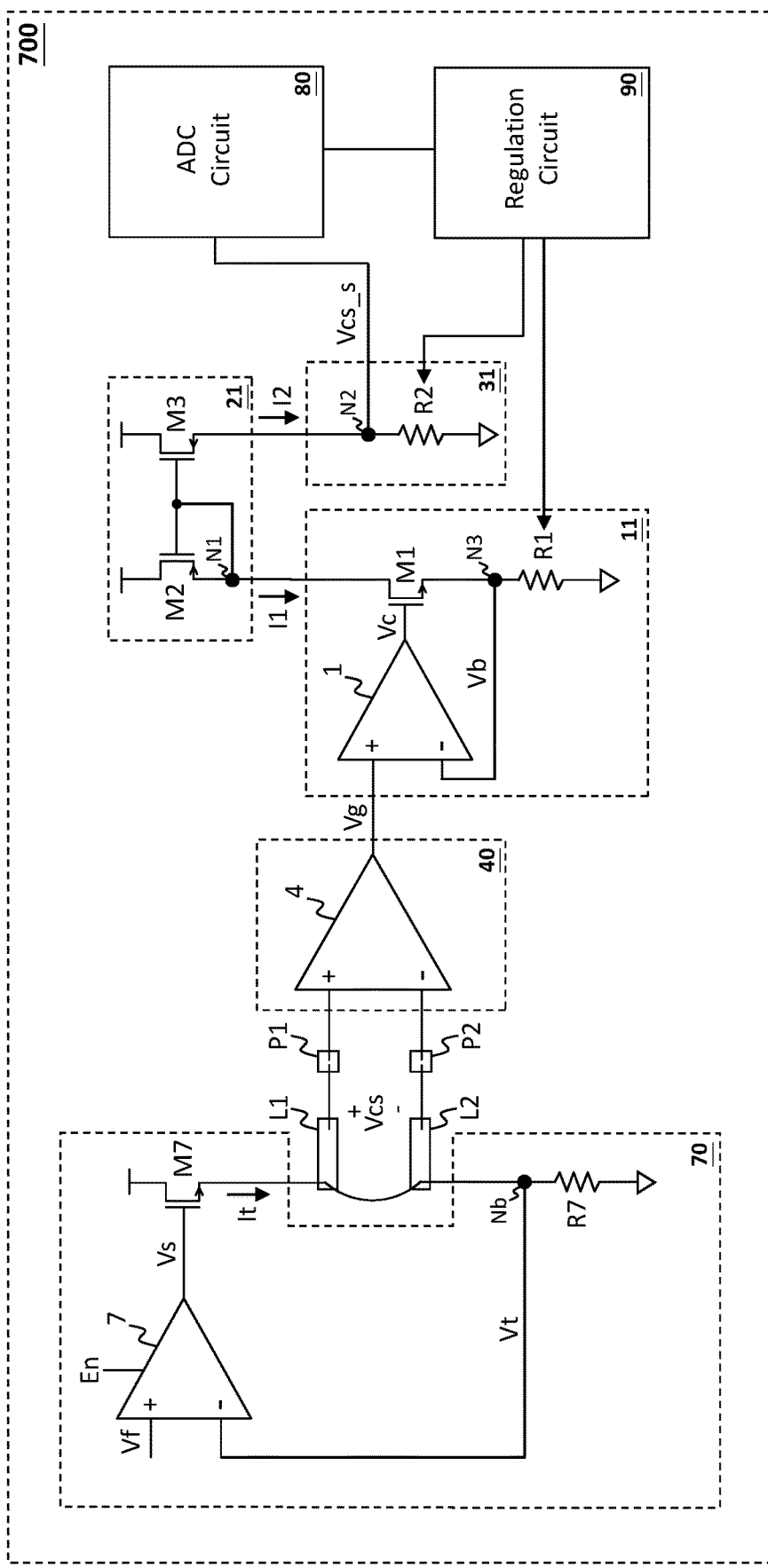
FIG. 7 shows a specific embodiment of a current sensing circuit having self-calibration according to the present invention.

FIG. 7 shows a specific embodiment of a current sensing circuit having self-calibration according to the present invention (current sensing circuit 7000). In this embodiment, the configurations and the operations of the gain stage circuit 40, the V2I circuit 11, the current mirror circuit 21 and the I2V circuit 31 in a sensing and calibration circuit 700 are the same as the embodiment in FIG. 5A, so they will not be redundantly explained here.

As shown in FIG. 7, in one embodiment, the sensing and calibration circuit 700 further includes a current generating circuit 70, an analog to digital conversion circuit 80 (ADC circuit 80) and an adjusting circuit 90. In one embodiment, the current generating circuit 70 includes an error amplifier circuit 7, a test transistor M7 and a test resistor R7. In one embodiment, the current generating circuit 70 is configured to operably generate a test current It having a first level and a second level during a first test, and after the first test, whenever the current sensing circuit is power-on and executes a power-on test procedure, the current generating circuit 70 generates the test current It having the first current level and the second current level.

In one specific embodiment, the current levels of the test current It is determined according to a test voltage Vt and a test resistor R7. Specifically, the error amplifier circuit 7 is configured to operably amplify a difference between the test voltage Vt and a test reference voltage Vf according to an enable signal En to generate a test signal Vs. The test transistor M7 generates the test current It according to the test signal Vs. Because a first terminal of the test transistor M7 (e.g. corresponding to a source of the test transistor M7) is coupled to the lead L1 and the test resistor R7 is coupled to the lead L2, the test current It flows through the sensing element Sc and the test resistor R7; the test current It flowing through the test resistor R7 generates the test voltage Vt at a feedback node where the lead L2 and the test resistor R7 are connected at. In one embodiment, the test reference voltage Vf corresponds to a positive input terminal of the error amplifier circuit 7 and the feedback voltage Vb corresponds to a negative input terminal of the error amplifier circuit 7, to form a negative feedback path. In this embodiment, the test current It can be determined according to the test reference voltage Vf and the test resistor R7.

In one embodiment, the ADC circuit 80 is configured to operably convert the current sensing output signal Vcs_s to a digital signal. In the production mode, the ADC circuit 80 determines an initial resistance of the sensing element Sc according to the test current It having the first current level and the test current It having the second current level and the corresponding digital signals; in a power-on test procedure, the ADC circuit 80 determines a real-time resistance of the sensing element Sc according to the test current It having the first current level and the test current It having the second current level and the corresponding digital signals.

Specifically, in one embodiment, in a first period in the production mode, the test current It is set to a first current level (e.g. 0.2 A), and the corresponding digital signal is the first digital signal; in a second period in the production mode, the test current It is set to a second current level (e.g. 0 A), and the corresponding digital signal is the second digital signal. In a power-on test procedure and in a third period, the test current It is set to the first current level (e.g. 0.2 A), and the corresponding digital signal is the third digital signal; in a fourth period in the power-on test procedure, the test current It is set to a second current level (e.g. 0 A), and the corresponding digital signal is the fourth digital signal. In one embodiment, an initial resistance of the sensing element Sc is determined according to the first current level, the first digital signal, the second current level and the second digital signal; and a real-time resistance of the sensing element Sc is determined according to the first current level, the third digital signal, the second current level and the fourth digital signal.

Note that the sensing element Sc may be aging with time due to e.g. oxidation or solder joint loose, so the real-time resistance may change with time.

In one embodiment, in the power-on test procedure, the adjusting circuit 90 is configured to operably control the resistance of the first adjusting resistor R1 and/or the resistance of the second adjusting resistor R2 according to the initial resistance and the real-time resistance of the sensing element Sc to compensate a difference between the real-time resistance and the initial resistance, such that the real-time current sensing output signal Vcs_s does not change even though the resistance of the sensing element Sc changes over time, that is, the value of the real-time current sensing output signal Vcs_s is not affected by the aging of the sensing element Sc.

Note that due to for example imperfect matching among the components and/or deviations in manufacture, an ideal result may not be obtained, so the term "substantially" as used in this specification means that errors within a tolerable range are acceptable.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A current sensing circuit having self-calibration, comprising:
   two leads;
   a sensing element having a sensing resistance, wherein the sensing element has two ends which are respectively coupled to the two leads; and
   a sensing and calibration circuit, configured to operably sense and calibrate a sensing voltage across the two ends of the sensing element, and configured to operably sense a sensing current flowing through the sensing element according to the sensing resistance and the sensing voltage, to generate a current sensing output signal, wherein the sensing and calibration circuit includes:
      two pads, respectively coupled to the two leads;
      a voltage to current conversion circuit (V2I circuit), configured to operably generate a first current at a first node according to the sensing voltage, wherein the V2I circuit includes a first adjusting resistor, wherein the first current is determined according to the resistance of the first adjusting resistor;
      a current mirror circuit, coupled to the first node, and configured to operably generate a second current at a second node according to the first current; and
      a current to voltage conversion circuit (I2V circuit), configured to operably generate the current sensing output signal according to the second current, wherein the I2V circuit includes a second adjusting resistor, wherein the current sensing output signal is determined according to a resistance of the second adjusting resistor;
   wherein the sensing element is a bonding wire or an extension of the leads, wherein when the sensing element is a bonding wire, the bonding wire has two ends which are respectively coupled to the two leads by bonding;
   wherein the sensing element has a first temperature coefficient (TC), wherein parameters of the first adjusting resistor and the second adjusting resistor are determined according to the first TC to compensate for the first TC, such that the current sensing output signal has a second TC which is substantially equal to 0;
   wherein the parameters of the first adjusting resistor and the second adjusting resistor include the resistance of the first adjusting resistor, a third TC of the first adjusting resistor, the resistance of the second adjusting resistor, and a fourth TC of the second adjusting resistor.

2. The current sensing circuit having self-calibration of claim 1, wherein the sensing and calibration circuit further includes a gain stage circuit which is coupled to the two pads, and configured to operably amplify the sensing voltage to generate a gain voltage; wherein the V2I circuit is coupled to the gain stage circuit, and configured to operably generate the first current at the first node according to the gain voltage.

3. The current sensing circuit having self-calibration of claim 2, wherein the gain stage circuit is configured as a differential amplifier circuit with a single output, wherein a voltage level of the gain voltage is a voltage level of the sensing voltage multiplied by a voltage scale-up factor, wherein the voltage scale-up factor is larger than or equal to 1.

4. The current sensing circuit having self-calibration of claim 2, wherein the V2I circuit further includes:
   an error amplifier circuit, configured to operably amplify a difference between a feedback voltage and the gain voltage to generate an error amplified signal; and
   a first transistor, controlled by the error amplified signal to generate the first current at the first node, wherein the first current flows through a first terminal and a second terminal of the first transistor;
   wherein the first adjusting resistor is coupled to the second terminal of the first transistor, and the first current flows through the first adjusting resistor, such that the feedback voltage is generated at a third node where the second terminal of the first transistor and the first adjusting resistor are connected at.

5. The current sensing circuit having self-calibration of claim 2, wherein the current mirror circuit includes:
   a second transistor, wherein a first terminal of the second transistor is coupled to a control terminal of the second transistor, and the first terminal of the second transistor is further coupled to the first node, wherein the first current flows through the first and second terminals of the second transistor; and
   a third transistor, wherein a control terminal of the third transistor is coupled to the control terminal of the second transistor, such that the first current is mirrored to generate the second current at the second node, wherein the second current flows through a first terminal and a second terminal of the third transistor;
   wherein the second adjusting resistor is coupled to the second node, and the second current flows through the second adjusting resistor, such that the current sensing output signal is generated at the second node.

6. A current sensing circuit having self-calibration, comprising:
   two leads;
   a sensing element having a sensing resistance, wherein the sensing element has two ends which are respectively coupled to the two leads, wherein the sensing element has a first temperature coefficient (TC); and
   a sensing and calibration circuit, configured to operably sense and calibrate a sensing voltage of the sensing element, and configured to operably sense a sensing current flowing through the sensing element according to the sensing resistance and the sensing voltage, to generate a current sensing output signal, wherein the sensing and calibration circuit includes:

two pads, respectively coupled to the two leads;

a voltage to current conversion circuit (V2I circuit), configured to operably generate a first current at a first node according to the sensing voltage, wherein the V2I circuit includes a first adjusting resistor, wherein the first current is determined according to the resistance of the first adjusting resistor;

a current mirror circuit, coupled to the first node, configured to operably generate a second current at a second node according to the first current;

a current to voltage conversion circuit (I2V circuit), configured to operably generate the current sensing output signal according to the second current, wherein the I2V circuit includes a second adjusting resistor, wherein the current sensing output signal is determined according to a resistance of the second adjusting resistor;

a temperature sensing circuit, configured to operably sense a first reference temperature and a second reference temperature in a production mode, and sense an operating temperature in an operation mode; wherein the first TC is determined according to the first reference temperature, the current sensing output signal at the first reference temperature, the second reference temperature, and the current sensing output signal at the second reference temperature; and an adjusting circuit, configured to operably adjust the resistance of the first adjusting resistor and/or the resistance of the second adjusting resistor according to the first TC and the operating temperature in the operation mode to compensate the first TC, such that the current sensing output signal has a second TC which is substantially equal to 0;

wherein the sensing element is a bonding wire or an extension of the leads, wherein when the sensing element is a bonding wire, the bonding wire has two ends which are respectively coupled to the two leads by bonding.

7. The current sensing circuit having self-calibration of claim 6, wherein the sensing and calibration circuit further includes a gain stage circuit which is coupled to the two pads, and configured to operably amplify the sensing voltage to generate a gain voltage; wherein the V2I circuit is coupled to the gain stage circuit, and configured to operably generate the first current at the first node according to the gain voltage.

8. The current sensing circuit having self-calibration of claim 7, wherein the gain stage circuit is configured as a differential amplifier circuit with a single output, wherein a voltage level of the gain voltage is a voltage level of the sensing voltage multiplied by a voltage scale-up factor, wherein the voltage scale-up factor is larger than or equal to 1.

9. The current sensing circuit having self-calibration of claim 7, wherein the V2I circuit further includes:

an error amplifier circuit, configured to operably amplify a difference between a feedback voltage and the gain voltage to generate an error amplified signal, wherein the gain voltage corresponds to a positive input terminal of the error amplifier circuit; and a first transistor, controlled by the error amplified signal to generate the first current at the first node, wherein the first current flows through a first terminal and a second terminal of the first transistor;

wherein the first adjusting resistor is coupled to the second terminal of the first transistor, and the first current flows through the first adjusting resistor, such that the feedback voltage is generated at a third node where the second terminal of the first transistor and the first adjusting resistor are connected at.

10. The current sensing circuit having self-calibration of claim 7, wherein the current mirror circuit includes:

a second transistor, wherein a first terminal of the second transistor is coupled to a control terminal of the second transistor, and the first terminal of the second transistor is further coupled to the first node, wherein the first current flows through the first and second terminals of the second transistor; and a third transistor, wherein a control terminal of the third transistor is coupled to the control terminal of the second transistor, such that the first current is mirrored to generate the second current at the second node, wherein the second current flows through a first terminal and a second terminal of the third transistor;

wherein the second adjusting resistor is coupled to the second node, and the second current flows through the second adjusting resistor, such that the current sensing output signal is generated at the second node.

11. A current sensing circuit having self-calibration, comprising:

two leads;

a sensing element having a sensing resistance, wherein the sensing element has two ends which are respectively coupled to the two leads; and a sensing and calibration circuit, configured to operably sense and calibrate a sensing voltage of the sensing element, and configured to operably sense a sensing current flowing through the sensing element according to the sensing resistance and the sensing voltage, to generate a current sensing output signal, wherein the sensing and calibration circuit includes:

two pads, respectively coupled to the two leads;

a voltage to current conversion circuit (V2I circuit), configured to operably generate a first current at a first node according to the sensing voltage, wherein the V2I circuit includes a first adjusting resistor, wherein the first current is determined according to the resistance of the first adjusting resistor;

a current mirror circuit, coupled to the first node, configured to operably generate a second current at a second node according to the first current;

a current to voltage conversion circuit (I2V circuit), configured to operably generate the current sensing output signal according to the second current, wherein the I2V circuit includes a second adjusting resistor, wherein the current sensing output signal is determined according to a resistance of the second adjusting resistor;

a current generating circuit, configured to operably generate a test current;

an analog to digital conversion circuit (ADC circuit), configured to operably convert the current sensing output signal to a digital signal, wherein in a first period in a production mode, the test current is set to a first current level, such that the digital signal corresponds to a first digital signal, and in a second period in the production mode, the test current is set to a second current level, such that the digital signal corresponds to a second digital signal, wherein in a third period in a power-on test procedure, the test current is set to the first current level, such that the digital signal corresponds to a third digital signal, and in a fourth period in the power-on test procedure, the test current is set to a second current level, such that the digital signal corresponds to a fourth digital signal; wherein an initial resistance of the sensing element is determined according to the first current level, the first digital signal, the second current level and the second digital signal, and wherein a real-time resistance of the sensing element is determined according to the first current level, the third digital signal, the second current level and the fourth digital signal; and an adjusting circuit, wherein in the power-on test procedure, the adjusting circuit is configured to operably control the resistance of the first adjusting resistor and/or the resistance of the second adjusting resistor according to the initial resistance and the real-time resistance of the sensing element to compensate a difference between the real-time resistance and the initial resistance, such that the real-time current sensing output signal does not substantially change in the situation that the sensing element changes over time;

wherein the sensing element is a bonding wire or an extension of the leads, and wherein when the sensing element is a bonding wire, the bonding wire has two ends which are respectively coupled to the two leads by bonding.

12. The current sensing circuit having self-calibration of claim 11, wherein the sensing element has a first temperature coefficient (TC), wherein the sensing and calibration circuit further includes a temperature sensing circuit, configured to operably sense a first reference temperature and a second reference temperature in the production mode, and sense an operating temperature in an operation mode; wherein the first TC is determined according to the first reference temperature, the current sensing output signal at the first reference temperature, the second reference temperature, and the current sensing output signal at the second reference temperature;

wherein the adjusting circuit is further configured to operably adjust the resistance of the first adjusting resistor and/or the resistance of the second adjusting resistor according to the first TC and the operating temperature in the operation mode to compensate the first TC, such that the current sensing output signal has a second TC which is substantially equal to 0.

13. The current sensing circuit having self-calibration of claim 11, wherein the current generating circuit includes:

a first error amplifier circuit, configured to operably amplify a difference between a test voltage and a test reference voltage according to an enable signal to generate a test signal;

a test transistor, controlled by the test signal to generate a test current, wherein a first terminal of the test transistor is coupled to a first lead of the two leads, wherein the test current flows through the sensing element; and a test resistor, coupled to a second lead of the two leads, wherein the test current flows through the test resistor, such that the test voltage is generated at a feedback node where the second lead and the test resistor are connected at;

wherein a current level of the test current is determined according to the test voltage and the test resistor.

14. The current sensing circuit having self-calibration of claim 11, wherein the sensing and calibration circuit further includes a gain stage circuit which is coupled to the two pads, and configured to operably amplify the sensing voltage to generate a gain voltage; wherein the V2I circuit is coupled to the gain stage circuit, and configured to operably generate the first current at the first node according to the gain voltage.

15. The current sensing circuit having self-calibration of claim 14, wherein the gain stage circuit is configured as a differential amplifier circuit with a single output, wherein a voltage level of the gain voltage is a voltage level of the sensing voltage multiplied by a voltage scale-up factor, wherein the voltage scale-up factor is larger than or equal to 1.

16. The current sensing circuit having self-calibration of claim 14, wherein the V2I circuit further includes:

a second error amplifier circuit, configured to operably amplify a difference between a feedback voltage and the gain voltage to generate an error amplified signal, wherein the gain voltage corresponds to a positive input terminal of the error amplifier circuit; and a first transistor, controlled by the error amplified signal to generate the first current at the first node, wherein the first current flows through a first terminal and a second terminal of the first transistor;

wherein the first adjusting resistor is coupled to the second terminal of the first transistor, and the first current flows through the first adjusting resistor, such that the feedback voltage is generated at a third node where the second terminal of the first transistor and the first adjusting resistor are connected at.

17. The current sensing circuit having self-calibration of claim 14, wherein the current mirror circuit includes:

a second transistor, wherein a first terminal of the second transistor is coupled to a control terminal of the second transistor, and the first terminal of the second transistor is further coupled to the first node, wherein the first current flows through the first and second terminals of the second transistor; and a third transistor, wherein a control terminal of the third transistor is coupled to the control terminal of the second transistor, such that the first current is mirrored to generate the second current at the second node, wherein the second current flows through a first terminal and a second terminal of the third transistor;

wherein the second adjusting resistor is coupled to the second node, and the second current flows through the second adjusting resistor, such that the current sensing output signal is generated at the second node.

* * * * *